United States Patent [19]
McClure

[11] Patent Number: 5,521,880
[45] Date of Patent: May 28, 1996

[54] INTEGRATED CIRCUIT MEMORY HAVING CONTROL CIRCUITRY FOR SHARED DATA BUS

[75] Inventor: David C. McClure, Denton, Tex.

[73] Assignee: SGS-Thomson Microelectronics, Inc., Carrollton, Tex.

[21] Appl. No.: 251,718

[22] Filed: May 31, 1994

[51] Int. Cl.$^6$ ........................................ G11C 8/00
[52] U.S. Cl. .................. 365/233.5; 365/230.03; 365/230.06
[58] Field of Search ........................... 365/231, 233, 365/233.5, 230.03, 230.06

[56] References Cited

U.S. PATENT DOCUMENTS

| | | | |
|---|---|---|---|
| 5,247,644 | 9/1993 | Johnson et al. | 395/425 |
| 5,270,974 | 12/1993 | Reddy | 365/200 |
| 5,343,427 | 8/1994 | Teruyama | 365/189.04 |

*Primary Examiner*—Do Hyun Yoo
*Assistant Examiner*—Andrew Q. Tran
*Attorney, Agent, or Firm*—Rodney M. Anderson; Lisa K. Jorgenson; Richard K. Robinson

[57] ABSTRACT

A memory system includes two memory arrays coupled to a global data bus via respective address decode circuits. Address control circuitry defaults to the weaker memory array upon receiving a new address such that the stronger memory array will not produce false values on the bus prior to stabilization of the address and proper decode. Consequently, the weaker memory array is not faced with a situation where it must overcome the previous false signal prior to developing the proper output values on the bus.

14 Claims, 5 Drawing Sheets

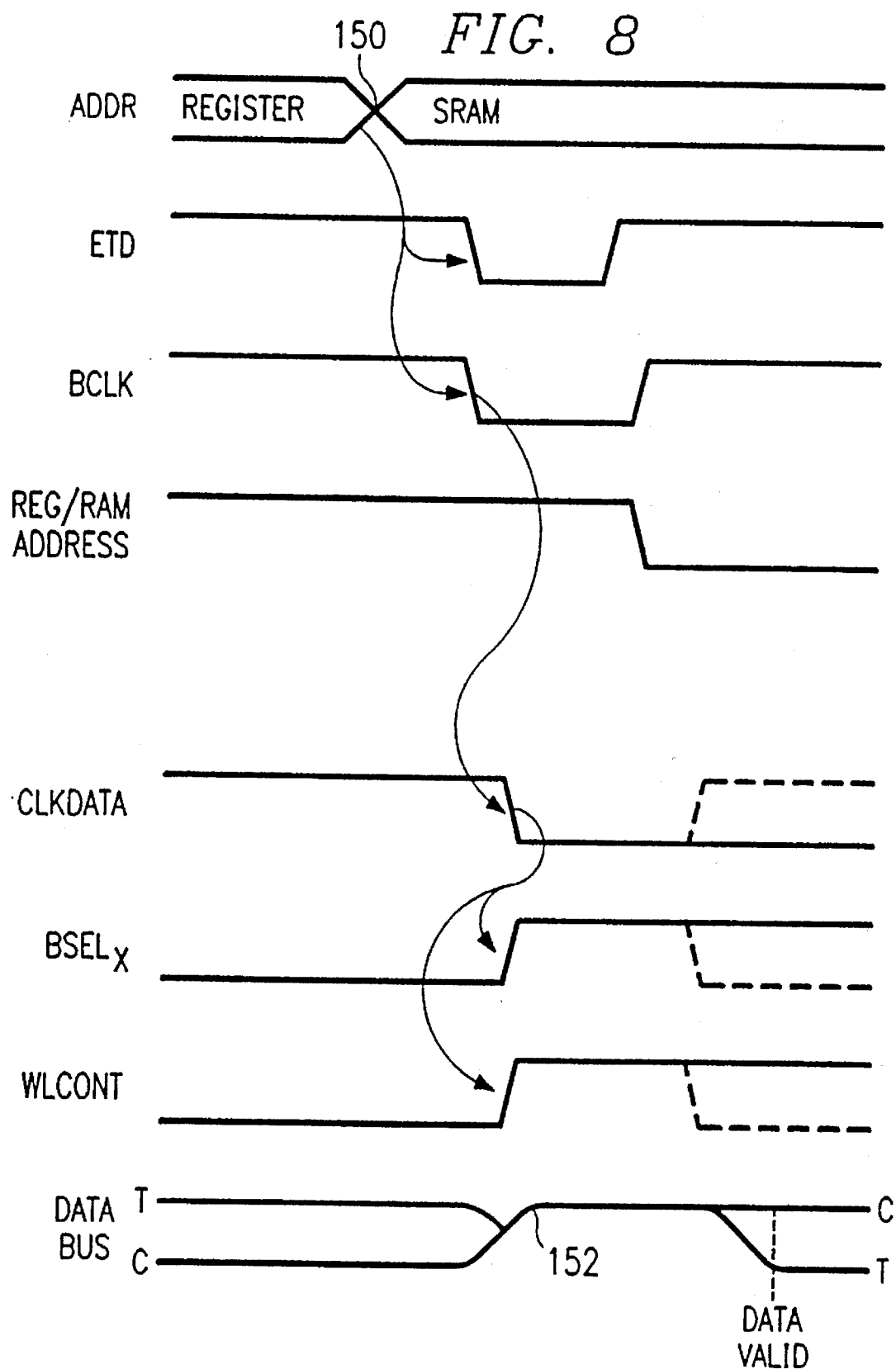

# 5,521,880

INTEGRATED CIRCUIT MEMORY HAVING CONTROL CIRCUITRY FOR SHARED DATA BUS

TECHNICAL FIELD OF THE INVENTION

This invention relates in general to integrated circuits, and more particularly to control circuitry for sharing a bus between a RAM array and a register array.

BACKGROUND OF THE INVENTION

In the design of an integrated circuit, it may be useful to provide a first array of memory having one set of operating constraints (such as registers) along with a second memory array (such as a static RAM or a dynamic RAM) having a second set of operating constraints, with both memory arrays sharing a single data bus. A simplified block diagram of this circuitry is shown in FIG. 1. The register array 10 is coupled to a global data bus 12 via a register address decoder 14 including column decoder 14a, row decoder 14b and control circuitry 14c. Similarly, a RAM array 16 is coupled to the global bus 12 via RAM address decoder 18, including column decoder 18a, row decoder 18b and control circuitry 18c. Central read/write sense amp circuitry 20 is coupled to the global bus 12. The sense amp provides the data output responsive to reading the data on the global bus 12.

Data is developed on the register array 10 responsive to signals from the register address decode circuitry 14. Similarly, data is developed on the bitlines of the RAM array 16 responsive to signals from the RAM address decode circuitry 18. The address signal is input to both the register address decode circuitry 14 and the RAM address decode circuitry 18. Because it is difficult to identically decode the address signals to both the register array 10 and RAM array 16, a false signal may be generated on the data bus by one array which must be overcome by the other array, causing access push-out, where the access time is increased due to the longer time period until the bus data is valid. This problem is compounded where the devices used in one array (in this case, register array 10) generate a stronger signal than the devices used in the other array (in this case, RAM array 16) or where the bitline capacitance of one array (in this case, register array 10) is significantly less than the bitline capacitance in the other array (in this case, RAM array 16). In this case the push-out is increased.

The aforementioned problem is best understood in connection with the timing diagram of FIG. 2. At the time designated by point 30, the signal on the address lines is changing from an address corresponding to the memory space of the register array 10 to an address corresponding to the address space of the RAM array 16. After the address has changed, the ETD signal (Edge Transition Detection) generates a logical low pulse of predetermined duration starting at point 32. One effect of the logic low pulse of the ETD signal is a precharging of the global bus (DATA) at point 34. The row and column select lines of the register array 10, however, are not deselected responsive to the change in address until point 36. Hence, the precharged signal on the data lines will be affected by the signal on the column lines of the register array (which has not yet been deselected) resulting in the formation of a false signal at point 38. By the time the row and column select signals for the RAM are selected at point 40, a significant false signal has been generated on the data lines which must be overcome by the weaker devices (and higher column capacitance) of the RAM array 16. A true signal is not developed on the data lines until point 42.

Because of the independent addressing paths to the register array 10 and the RAM array 16, processing variations, temperature, voltages and the nature of the respective decode circuits, may result in time imbalances between the select-to-deselect time of the register address decode circuitry 22 and the deselect-to-select time of the RAM address decode circuitry 24. Consequently, the register array may drive the bus 12 for 1–2 nanoseconds after precharging which will result in a 5–6 nanosecond push-out on the data lines as the RAM array overcomes the false signal. As a result, the access time is significantly increased.

Therefore, a need has arisen in the industry for access control circuitry which overcomes the false signals otherwise generated by multiple memory arrays driving a single bus.

SUMMARY OF THE INVENTION

The memory system of the present invention comprises a first memory array and a second memory array coupled to a common data bus. Access to the bus is controlled by addressing circuitry including first decode circuitry for selectively coupling the data bus to the first memory array responsive to an address within a first predetermined address space, second decode circuitry for selectively coupling the data bus to the second memory array responsive to an address within a second predetermined memory space and control circuitry coupled to the first and second decode circuits for coupling the first memory array to the bus and decoupling the second memory array from the bus responsive to each change in address to prevent data from the second memory array from affecting the data bus until after the new address is stable and decoded by the first and second decode circuits.

The present invention provides significant advantages. Since the first array does not need to overcome voltage levels imposed on the bus by the second array, the access time for a read from the first memory array is significantly reduced, particularly when the second memory array comprises an array of relatively stronger devices, such as in the case of a register array.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 illustrates a timing diagram illustrating operation of the preferred embodiment.

DETAILED DESCRIPTION OF THE INVENTION

The preferred embodiment of the present invention and its advantages are best understood by referring to FIGS. 3–8 of the drawings, like numerals being used for like and corresponding parts of the various drawings.

Figure 3:
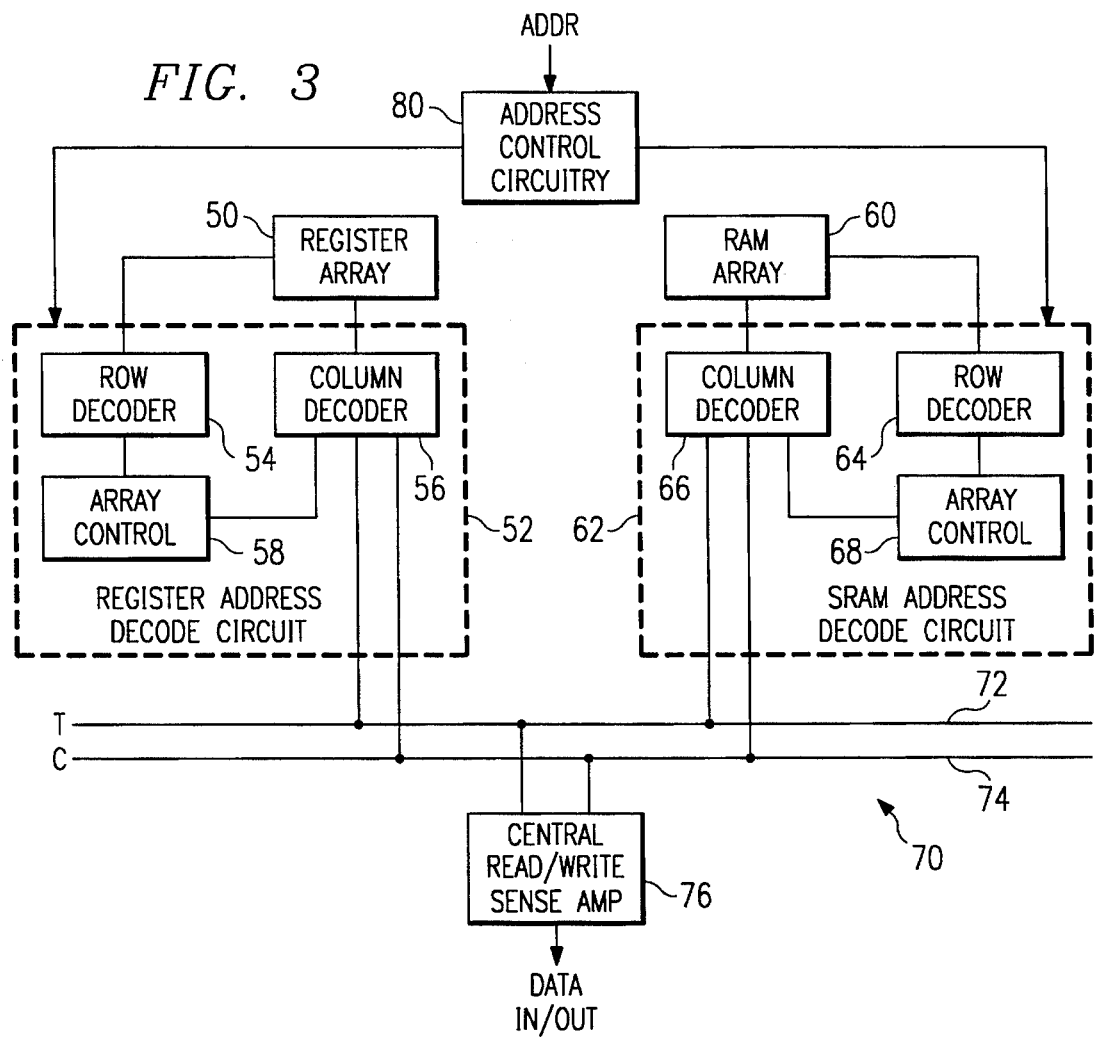
FIG. 3 illustrates a general block diagram of the preferred embodiment of the present invention.

FIG. 3 illustrates a general block diagram of a preferred embodiment of the present invention. The preferred embodiment shown in FIG. 3 is used in an application where the integrated circuit includes both an SRAM and a real-time clock. It will be assumed that the SRAM includes 8K bytes of storage, with the top nine bytes of the SRAM's address space being a dual ported register array for use by the real-time clock; however, the particular application and the particular sizes of the register array and the SRAM array are unimportant for operation of the present invention.

As shown in FIG. 3, a clock register array (hereinafter the "register array") 50 is coupled to a address decode circuit 52, including a row decoder 54, a column decoder 56 and array control circuitry 58. Similarly, an SRAM array 60 is coupled to an address decode circuit 62, including a row decoder 64, a column decoder 66, and array decode circuitry 68. The column decoders 56 and 66 are coupled to the global bus 70, comprising a T (TRUE) line 72 and a C (Complement) line 74. The central read/write sense amp 76 is coupled to the global bus 70. Address control circuitry 80 is coupled to the address decode circuits 52 and 62.

In operation, the address control circuitry 80 generates one or more control signals responsive to a change in address which prevent the clock register array 50 from accessing the global bus 70 until the new address is stable and has been properly decoded. While the register array 50 is prevented from accessing the global bus 70, the SRAM array 60 is enabled to access the global bus 70 and may develop data signals responsive to the new address.

Figure 4:
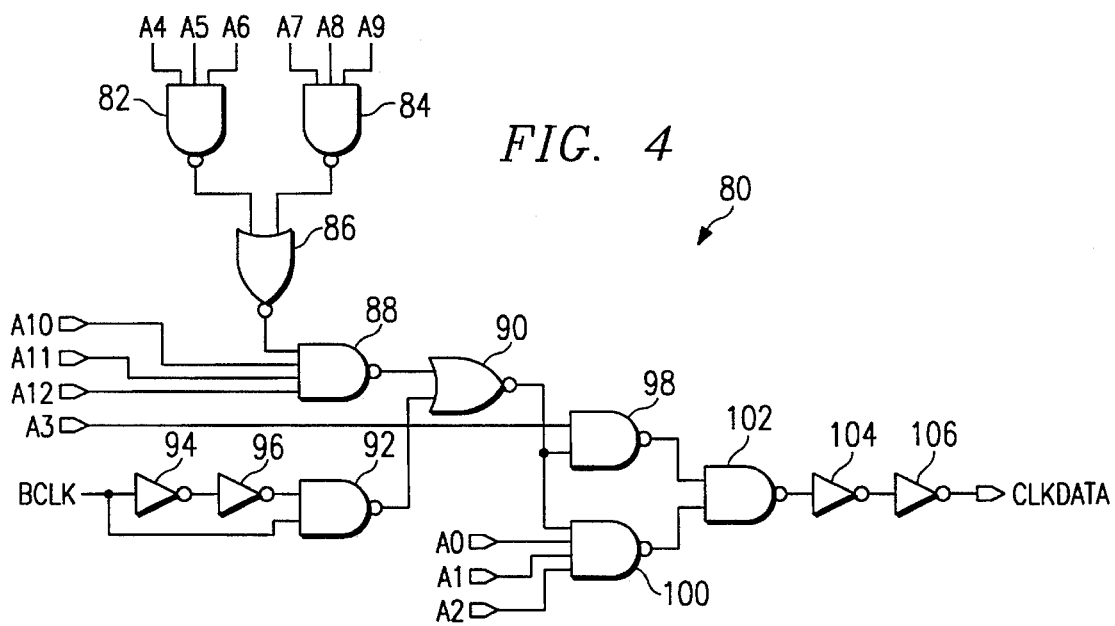
FIG. 4 illustrates a schematic representation of circuitry for generating an access control signal responsive to a change in address.

FIG. 4 illustrates a schematic representation of the control circuitry 80 for generating control signals responsive to a new address. NAND gate 82 is coupled to address lines A4, A5 and A6. NAND gate 84 is coupled to address lines A7, A8 and A9. NOR gate 86 is coupled to the outputs of NAND gates 82 and 84. The output of NOR gate 86 is coupled to an input of NAND gate 8S in conjunction with address lines A10, A11 and A12. The output of NAND gate 88 is coupled to the input of NOR gate 90, along with the output of NAND gate 92. NAND gate 92 has one input connected to a BCLK signal and the other input coupled to the BCLK signal after propagation through inverters 94 and 96. The output of NOR gate 90 is coupled to NAND gate 98, along with the A3 address line. The output of NOR gate 90 is further coupled to an input of NAND gate 100, along with address lines A0, A1 and A2. The outputs of NAND gates 98 and 100 are coupled to the inputs of NAND gate 102. The output of NAND gate 102 is coupled to the input of inverter 104. The output of inverter 104 is coupled to the input of inverter 106. The output of inverter 106 is the CLKDATA signal.

In operation, the BCLK signal transitions low responsive to a new address for a predetermined amount of time (see FIG. 8) to allow the address (ADDR) to stabilize and propagate through the address decoders 52 and 62. The BCLK signal may be generated internal or external to the address control circuitry 80. Inverters 94 and 96 ensure that the output of NAND gate 92 does not transition to a low logic level prior to a change in the output of NAND gate 88. NAND gate 88 outputs a low level if address lines A4–A12 are all at a high logic level. Otherwise, the output of NAND gate 88 is high. NOR gate 90 outputs a high logic level if address lines A4–A12 are all at high logic levels and BCLK is at a high logic level.

Thus, when BCLK transitions to a low logic level responsive to a new address, the output of NAND gate 92 is set to a high logic level, thereby generating a low logic level at the output of NOR gate 90. A low logic level on the output of NOR gate 90 creates a high logic level on the outputs of NAND gates 98 and 100; consequently, the output of NAND gate 102 and the CLKDATA signal are set to a low logic level. As will be discussed in greater detail in connection with FIGS. 5 and 6, when CLKDATA is at a low logic level, the bitlines of the register array 50 are decoupled from the global data bus 70 and the wordlines of the clock register array are disabled. Similarly, when CLKDATA is at a low logic level, the SRAM array 60 is coupled to the global bus 70 through its column decoder 66.

BCLK transitions high once the address bits (A0–A12) have been decoded and are stable. Once BCLK returns to a high logic level, the CLKDATA signal will remain at a low logic level or transition to a high logic level responsive to the address lines A0–A12. In the illustrated embodiment, when the top nine bytes of the 8K address space are mapped to the register array 50, the circuitry shown in FIG. 4 provides that the CLKDATA signal will transition high if either A3–A12 are high (thus creating a low logic level on the output of NAND gate 98) or if address lines A4–A12 and A0–A2 are at a logical high level (thereby creating a low logic level on the output NAND gate 100). Otherwise, the CLKDATA signal will remain at a logical low level.

Figure 5:
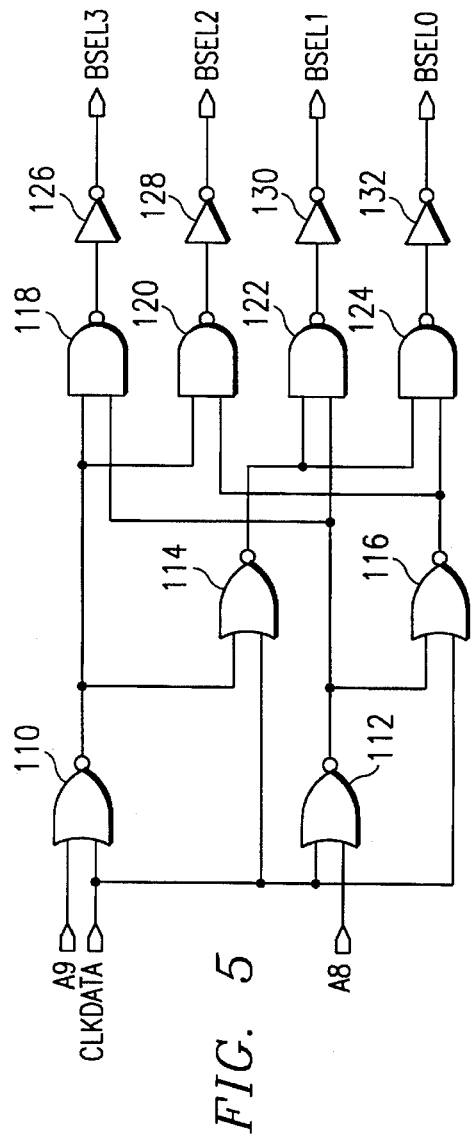
FIG. 5 illustrates a schematic representation of a circuit for enabling a RAM array responsive to the circuitry of FIG. 4.

FIG. 5 illustrates a schematic diagram of circuitry preferably part of the column decoder 66 which selects one set of bitlines from the SRAM array responsive to the CLKDATA signal and the A8 and A9 address lines. This circuitry includes NOR gate 110 coupled to address line A9 and the CLKDATA signal and NOR gate 112 coupled to address line A8 and the CLKDATA signal. NOR gate 114 is coupled to the output of NOR gate 110 and to the CLKDATA signal. NOR gate 116 is coupled to the output of NOR gate 112 and the CLKDATA signal. NAND gate 118 is coupled to the output of NOR gate 110 and to the output of NOR gate 112. NAND gate 120 is coupled to the output of NOR gate 110 and the output of NOR gate 116. NAND gate 122 is coupled to the output of NOR gate 114 and the output of NOR gate 112. NAND gate 124 is coupled to the output of NOR gate 114 and the output of NOR gate 116. The outputs of NAND gates 118–124 are coupled to the inputs of inverters 126–132, respectively. The output of inverter 132 is the BSEL0 signal, the output of inverter 130 is the BSEL1 signal, the output of inverter 128 is the BSEL2 signal and the output of inverter 126 is the BSEL3 signal.

In operation, if the CLKDATA signal is low, indicating that the SRAM array 60 is selected for coupling to the global bus 70, then one set of bitlines is selected responsive to the A8 and A9 address lines. If the CLKDATA signal is high, then the output of all NAND gates 118–124 will be high, resulting a low logic level output from the respective inverter 126–132. A low logic level on a BSELx signal disables that bank of bitlines from being connected to the global bus 70.

Figure 6:
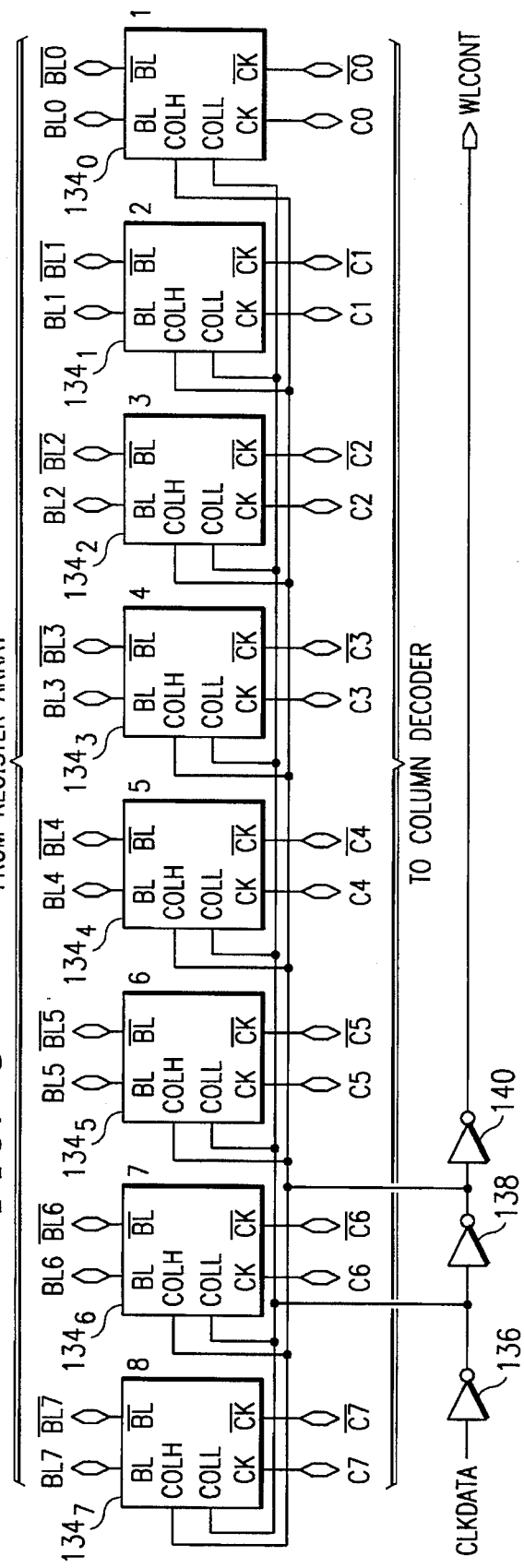
FIG. 6 illustrates a schematic representation of circuitry for disabling a register array responsive to the circuitry of FIG. 4.

FIG. 6 illustrates a schematic representation of a circuit preferably used in connection with the column decoder 56 of the address decode circuit 52. A plurality of pass gates 134$_0$–134$_7$ are coupled to respective pairs of TRUE and COMPLEMENT bitlines BL0/$\overline{BL0}$–BL7/$\overline{BL7}$. The outputs of the pass gates 134$_0$–134$_7$ are coupled to respective columns C0/$\overline{C0}$–C7/$\overline{C7}$. A first control input to the pass gates 134 is connected to the output of inverter 136 which has the CLKDATA signal as its input. The other control input of the pass gate is coupled to the output of inverter 138, which is coupled to the output of inverter 136. The output of inverter 138 is also coupled to inverter 140, which outputs the WLCONT signal.

In operation, when the CLKDATA signal is at a low logic level, the output of inverter 136 is high and the output of inverter 138 is low, thereby causing a high impedance between the bitlines and their respective column. This aspect of the pass gates is better described in connection with FIG. 7.

Figure 7:
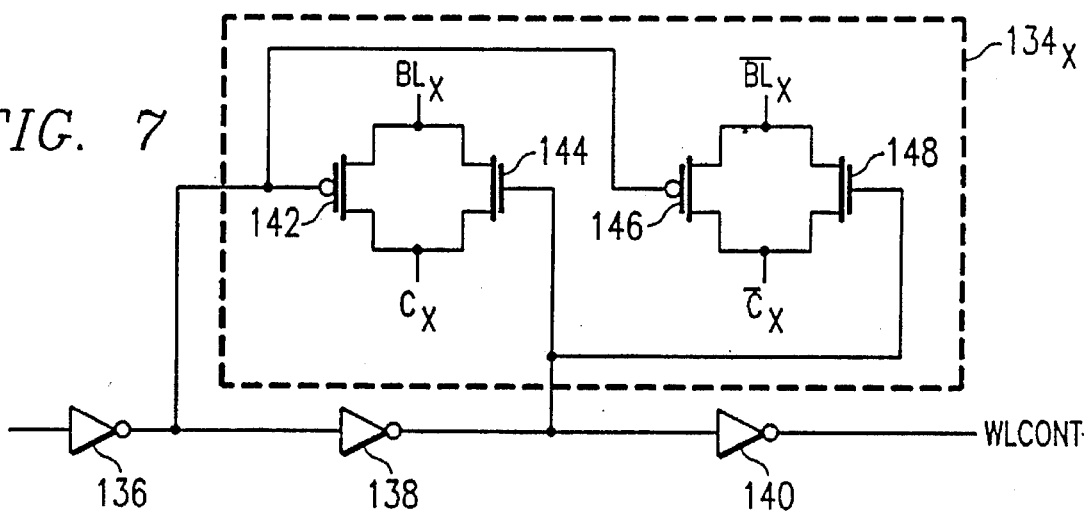
FIG. 7 illustrates a schematic representation of the pass gates used in FIG. 6.

In FIG. 7, a pass gate 134$_x$ comprises a first pair of complementary transistors, P-channel transistor 142 and N-channel transistor 144 having connected source/drains. BL$_x$ is coupled to one pair of connected source/drains and C$_x$ is coupled to the other pair of connected source/drains. The output of inverter 136 is coupled to the gate of P-channel transistor 142 and the output of inverter 138 is coupled to the gate of N-channel transistor 144. Similarly, a second of pair of transistors, P-channel transistor 146 and N-channel transistor 148, have coupled source/drains, with $\overline{BL}_x$ connected to one pair of connected source/drains and $\overline{C}_x$ coupled to the pair of connected source/drains. The gate of P-channel transistor 146 is connected to the output of inverter 136 and the gate of N-channel transistor 148 is coupled to the output of inverter 138. Hence, when CLKDATA is low, the output of inverter 136 will be high, thereby providing a high impedance between the source and drain of P-channel transistors 142 and 146 and the output of inverter 138 will be low, thereby creating a high impedance between the source and drain of N-channel transistors 144 and 148. Consequently, when the CLKDATA signal was low, all bitlines of the register array 50 are decoupled from the column lines of column decoder 56.

Returning to FIG. 6, the WLCONT signal is connected to the row decoder 54. In response to a high logic level on the WLCONT signal, the wordlines of the register array 50 would be disabled, such that no data will be developed on the bitlines responsive to the new address (until the CLKDATA signal transitions high).

Figure 1:
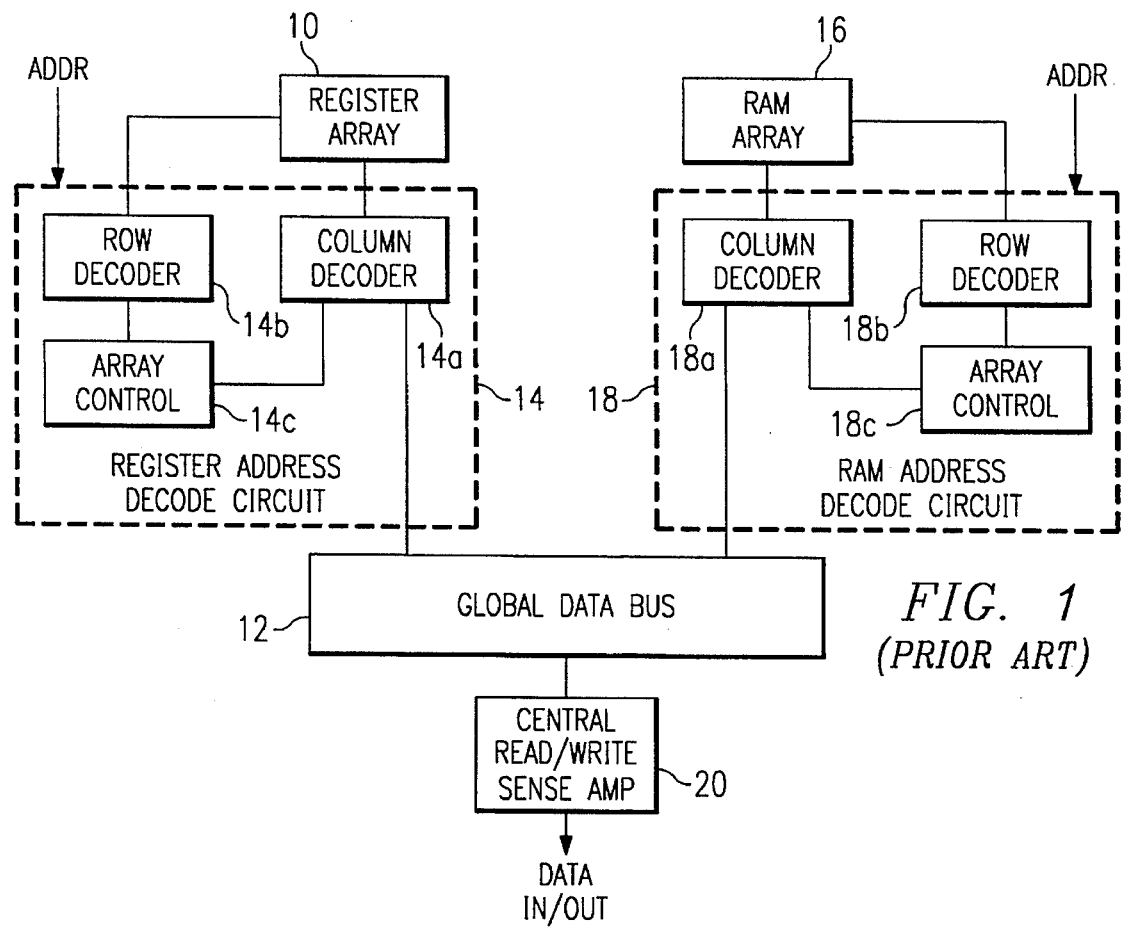
FIG. 1 illustrates a generalized block diagram of a memory system comprising two memory arrays coupled to a common bus.
Figure 2:
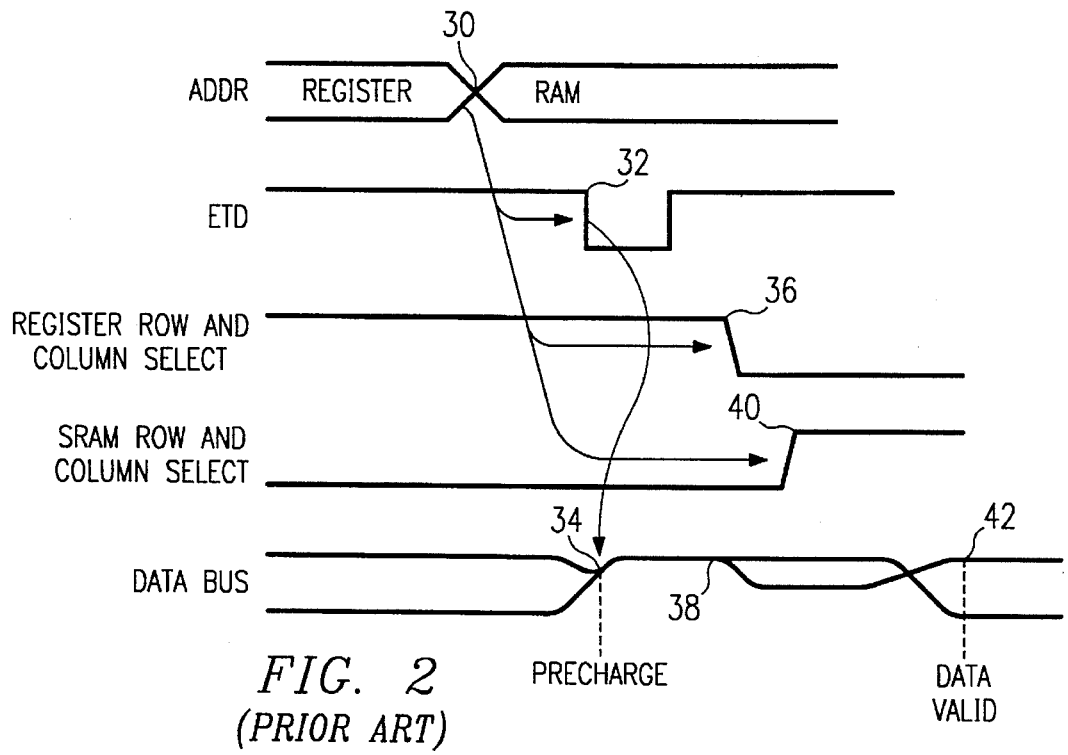
FIG. 2 illustrates a timing diagram illustrating a memory read from the RAM array of FIG. 1.

FIG. 8 illustrates a timing diagram showing the operation of the circuitry of FIGS. 3–7. At point 150, the values on the address lines change, resulting in a low logic pulse on the ETD signal and the BCLK signal. When BCLK goes low, the CLKDATA signal also goes low, causing one of the BSEL$_x$ signals (determined by the A8 and A9 address lines) to go high and the WLCONT signal to go high as well. At this point, the address is decoded by the SRAM's address decode circuit 62. Substantially simultaneously, the precharging is occurring on the data bus at point 152. As opposed to the timing diagram of FIG. 2, the register array 50 cannot affect the values on the global bus 70, and thus, the bus remains precharged until the data from the SRAM array 60 is output to the global bus. Consequently, the SRAM array 60 does not need to overcome an imbalance on the data bus created by the register array 50, and thus, the data is valid at a much earlier time. Once the BCLK signal transitions high, the CLKDATA signal may stay at a low logic level (if the new address is in the address space of the RAM array) or transition high (if the new address is in the address space of the register array), as shown by the dashed lines of FIG. 8. The BSELx and WLCONT signals also transition accordingly.

It should be noted that while the address control circuitry 80 slightly delays the access of the register array 50 to the bus 70, the register array 50 develops signal much faster because of the larger transistors used in the registers and the lower bitline capacitance. Hence, no significant degradation of access time with respect to the register array results from use of the address control circuitry 80.

The present invention provides a significant advantage over the prior art, namely that the time between the address transition to the point of which the data on the data bus is valid is decreased, particularly in connection with a transition from register address space to SRAM address space. It should be noted that while the invention has been described in connection with two arrays, one of which develops signals faster than the other. Hence, this same problem would exist if the SRAM array 60 were a DRAM array. The problem would also exist if the two memory arrays were of the same type (for example, both SRAM arrays) with one array having larger transistor sizes or a lesser bitline capacitance, and therefore, have the ability to charge the lines of the bus faster.

Although the present invention and its advantages have been described in detail, it should be understood that various changes, substitutions and alterations can be made herein without departing from the spirit and scope of the invention as defined by the appended claims. For example, an alternative embodiment might provide that each array be allowed access to a intermediate private bus, with the intermediate buses multiplexed to a shared data bus. The CLKDATA signal would be used to multiplex a default one of the intermediate buses upon an address transition, followed by a switch to bus associated with the new address, once the address lines were decoded and stable.

What is claimed is:

1. A memory system comprising:
    a data bus;
    a first memory array;
    a second memory array; and
    addressing circuitry comprising:
        first decode circuitry, coupled to said data bus and said first memory array, for selectively passing data to said data bus from said first memory array responsive to an address within a first predetermined address space;
        second decode circuitry, coupled to said data bus and said second memory array, for selectively passing data to said data bus from said second memory array responsive to an address within a second predetermined address space;
        control circuitry, coupled to said first and second decode circuitry, coupling said first memory array to said data bus and decoupling said second memory array from said data bus responsive to a new address input to said first and second decode circuitries and prior to such time that said new address is stable to prevent data from said second memory array from affecting said data bus until after said new address is stable and decoded by said first and second decode circuitries.

2. The memory system of claim 1 wherein said first memory array comprises a static random access memory.

3. The memory system of claim 1 wherein said first memory array comprises a dynamic random access memory.

4. The memory system of claim 1 wherein said second memory array comprises a register array.

5. The memory system of claim 1 wherein said control circuitry comprises circuitry for generating a first signal responsive to an address change.

6. The memory system of claim 5 wherein said addressing circuitry further comprises circuitry for generating a high impedance between bitlines associated with said second memory array and said data bus responsive to said first signal.

7. The memory system of claim 6 and further comprising circuitry for disabling wordlines associated with said second memory array responsive to said first signal.

8. Control circuitry for enabling access to a common bus shared between first and second memory arrays, comprising:

circuitry for generating a first signal responsive to each change of an address for addressing one of the memory arrays, said first signal having a first state occurring prior to a decode of the address to determine which memory array is associated with the address and a second state occurring after the address is stable and decoded;

circuitry, coupled to said circuitry for generating said first signal, for generating a second signal responsive to the first state of said first signal for enabling access of the bus by the first memory array and disabling access to the bus by the second memory array and, responsive to the second state of said first signal, for enabling access of the bus by the memory array associated with the address.

9. The control circuitry of claim 8 and further comprising circuitry for generating a high impedance between bitlines associated with said second memory array and said bus responsive to said second signal.

10. The control circuitry of claim 9 and further comprising circuitry for disabling wordlines associated with said second memory array responsive to said second signal.

11. A method of controlling a memory system including first and second memory arrays coupled to a common bus, comprising the steps of:

responsive to each change of address and prior to decoding the address, enabling access to the bus by the first memory array and disabling access to the bus by the second memory array; and after a known time period after which the address is stable and decoded, enabling access of the bus by the array associated with the address.

12. The method of claim 11 wherein said step of enabling access of the bus by the first memory array comprises the steps of:

generating a first signal responsive to each change of an address for addressing one of the memory arrays;

generating a second signal having first and second states responsive to the first signal and the address, said second signal having a first state occurring prior to a decode of the address to determine which memory array is associated with the address;

enabling access to the bus by the first memory array responsive to the first state of said second signal; and disabling access to the bus by the second memory array responsive to the first state of said second signal.

13. The method of claim 12 wherein said disabling step comprises the step of generating a high impedance between bitlines associated with the second memory array and the bus.

14. The method of claim 12 wherein said step of enabling access of the bus by the array associated with the address comprises the step of enabling access of the bus by the array being associated with the address responsive to whether said second signal transitions to said second state.

* * * * *